US006977536B2

(12) United States Patent
Chin-Chieh et al.

(10) Patent No.: US 6,977,536 B2
(45) Date of Patent: Dec. 20, 2005

(54) CLOCK MULTIPLIER

(75) Inventors: Chao Chin-Chieh, Hsinchu Hsien (TW); Su Chao-Ping, Hsinchu (TW); Chen Yen-Kuang, Chia Yi (TW)

(73) Assignee: Myson Century, Inc., Hsinchu (TW)

( * ) Notice: Subject to any disclaimer, the term of this patent is extended or adjusted under 35 U.S.C. 154(b) by 0 days.

(21) Appl. No.: 10/649,706

(22) Filed: Aug. 28, 2003

(65) Prior Publication Data

US 2004/0232955 A1 Nov. 25, 2004

(30) Foreign Application Priority Data

May 21, 2003 (TW) .............................. 92113767 A

(51) Int. Cl.[7] ............................................... H03B 19/00
(52) U.S. Cl. ....................................... 327/116; 327/119
(58) Field of Search ........................ 327/116, 119, 122, 327/123; 377/47–48

(56) References Cited

U.S. PATENT DOCUMENTS 4,527,075 A * 7/1985 Zbinden ..................... 327/175
5,315,164 A * 5/1994 Broughton .................. 327/175
5,963,071 A * 10/1999 Dowlatabadi ............... 327/175
6,060,922 A * 5/2000 Chow et al. ................ 327/175
6,426,660 B1 * 7/2002 Ho et al. .................... 327/175

* cited by examiner

*Primary Examiner*—My-Trang Nu Ton
*Assistant Examiner*—Cassandra Cox
(74) *Attorney, Agent, or Firm*—Connolly Bove Lodge & Hutz LLP; Larry J. Hume

(57) ABSTRACT

A clock multiplier capable of modulating the duty cycle of the output clock comprises a first clock multiplication circuit, an inverter, a first low pass filter, a second low pass filter and an amplifier, the first multiplication clock being operative to multiply the frequency of an input clock, the inverter being operative to invert the input clock, the first low pass filter receiving the output clock of the inverter for being charged or discharged, the second low pass filter receiving the output clock of the first clock multiplication circuit for being charged or discharged, the amplifier being operative to compare the output voltages of the first low pass filter and the second low pass filter to perform a feedback control, so as to modulate the duty cycle of the output clock of the first multiplication clock to approach 50%.

17 Claims, 10 Drawing Sheets

CLOCK MULTIPLIER

BACKGROUND OF THE INVENTION (A) Field of the Invention

The present invention is related to a clock multiplier, more specifically, to a clock multiplier capable of modulating the duty cycle of the output clock.

(B) Description of Related Art

With the rising demand of higher clock frequency to semiconductor devices, on-chip clock multipliers are widely used nowadays. Conventionally, the relatively expensive phase-lock loops (PLLs) and lower-cost clock doublers are chosen as multiplication solutions.

FIG. 1 illustrates a function block diagram of a clock multiplier 10 using PLL technique, which consists of a divided-by-M counter 11, a phase-frequency detector 12, a charge pump 13, a loop filter 14, a voltage-controlled oscillator (VCO) 15 and a divided-by-N counter 16. In accordance with such design, the frequency of the output clock (CLKOUT) is equivalent to that of the input clock (CLKIN) multiplied by N/M. Because of the high circuit complexity, the cost of silicon processing and testing overhead typically preclude the use of such PLLs in cost-sensitive integrated circuits.

FIG. 2 illustrates the circuitry and the timings of a known clock doubler 20. The clock doubler 20 consists of a delay line 22 and an exclusive OR (XOR) gate 24. If the period of a CLKIN is T, the delay line 22 will generate a delayed-clock (CLKDLY) delaying T/4. Accordingly, the CLKIN and the CLKDLY are inputted to the XOR gate 24 to generate a CLKOUT with double frequency. Although the clock doubler is much simpler and cheaper, it still suffers from two limitations. First, the useful frequency range is limited as a fixed delay line is used. Thus, if the applied frequency is changed, the delay line has to be changed as well. Secondly, the delay line is a circuit constituted by resistor-capacitor (RC) components, which are easily affected by process, temperature, supply voltage and clock frequency change, so the duty cycle of the delay line will be changed.

Nowadays, clock multipliers are widely applied in various digital integrated circuits. However, current clock multipliers are either more costly or ineligible, and thus it is necessary to develop a low-cost clock multiplier capable of adjusting the duty cycle of the output clock.

SUMMARY OF THE INVENTION

The objective of the present invention is to provide a clock multiplier capable of steadily controlling the output clock, so as to overcome the sensitivity of process drifting or temperature variation. Ideally, the clock multiplier can control the duty cycle of the output clock to be 50% to ascertain the output clock as having good quality.

The clock multiplier of the present invention comprises a first clock multiplication circuit, an inverter, a first low pass filter (LPF), a second LPF and an amplifier, the first clock multiplication circuit being operative to multiply the frequency of an input clock, the inverter being operative to invert the input clock, the first LPF receiving the output clock of the inverter for being charged or discharged, the second LPF receiving the output clock of the first clock multiplication circuit for being charged or discharged, and the amplifier being operative to compare the output voltages of the first LPF and the second LPF to perform a feedback control, so as to modulate the duty cycle of the output clock of the first multiplication clock to approach 50%. If the input clock has a full voltage swing, a one-half supply voltage ($V_{DD}/2$) can be selected as a reference voltage to substitute the inverter and the first LPF for simplifying the circuitry.

As to apply in a 2X clock multiplier (clock doubler), the above mentioned first clock multiplication circuit can be constituted by a first voltage-controlled delay line (VCDL) and a first XOR gate, the first VCDL being operative to delay the input clock, the output voltage of the amplifier being operative to modulate the delay time of the input clock, the first XOR gate receiving the input clock and the output clock of the first VCDL to double the frequency of the input clock.

Likewise, the feedback control mechanism can be used in a 3X, 4X or other multiple clock multiplier as well, and so long as the internal design of the first clock multiplication circuit performs a minor change, the clock multiplier will possess the same capability of modulating the duty cycle of a clock.

DETAILED DESCRIPTION OF THE INVENTION

First of all, some designations are determined for clear description, the input clocks of the clock multipliers of the following embodiments are designated as CLKINs, the periods of the CLKINs are designated as T, and the output clocks of the clock multipliers are designated as CLKOUTs.

Figure 1:
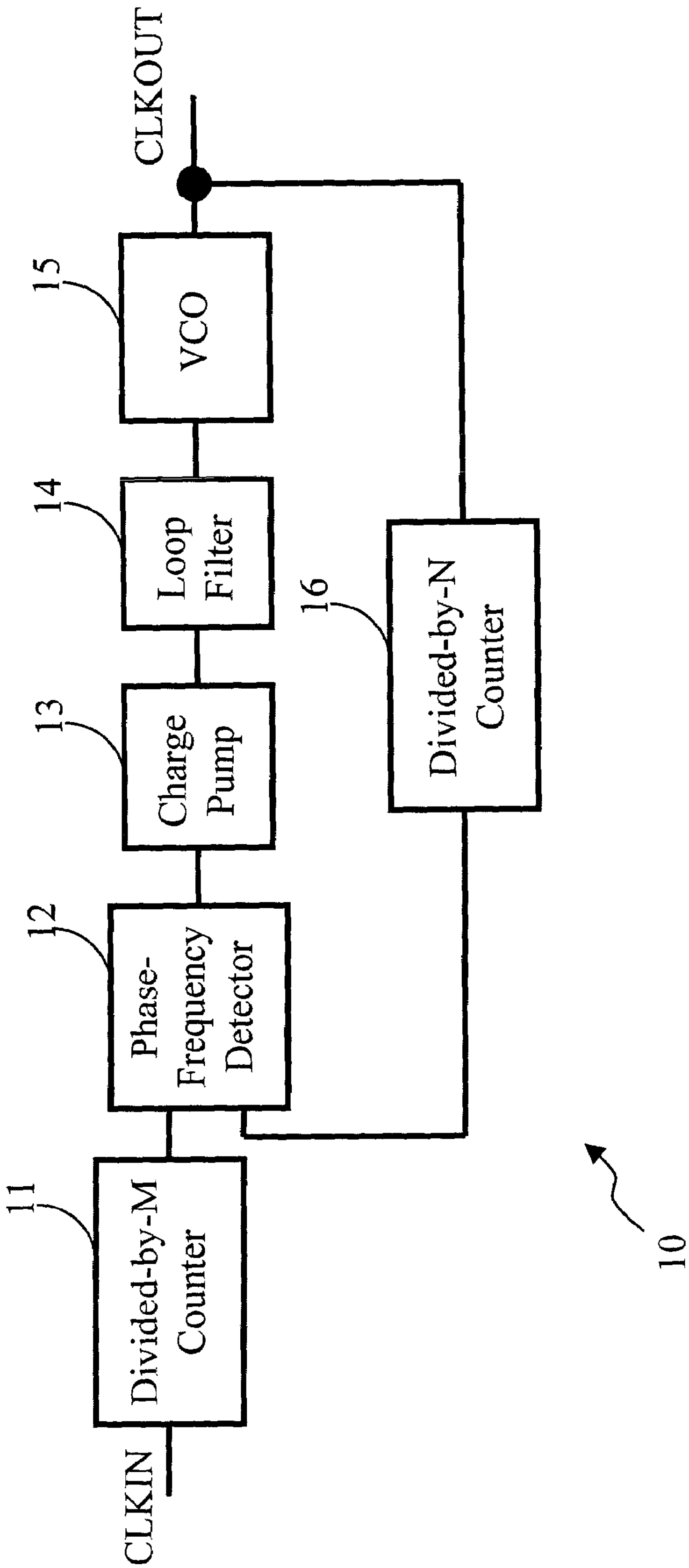
FIG. 1 illustrates a known PLL clock multiplier.
Figure 2:
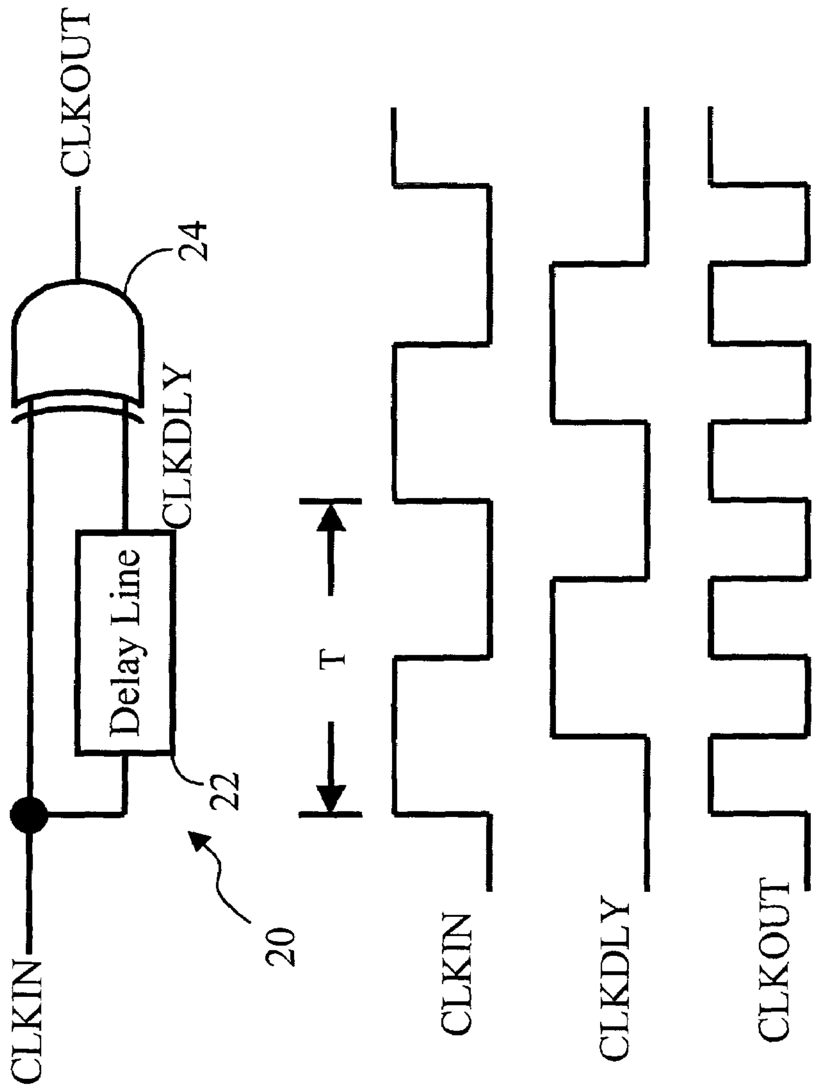
FIG. 2 illustrates a known clock multiplier and the timings.
Figure 3:
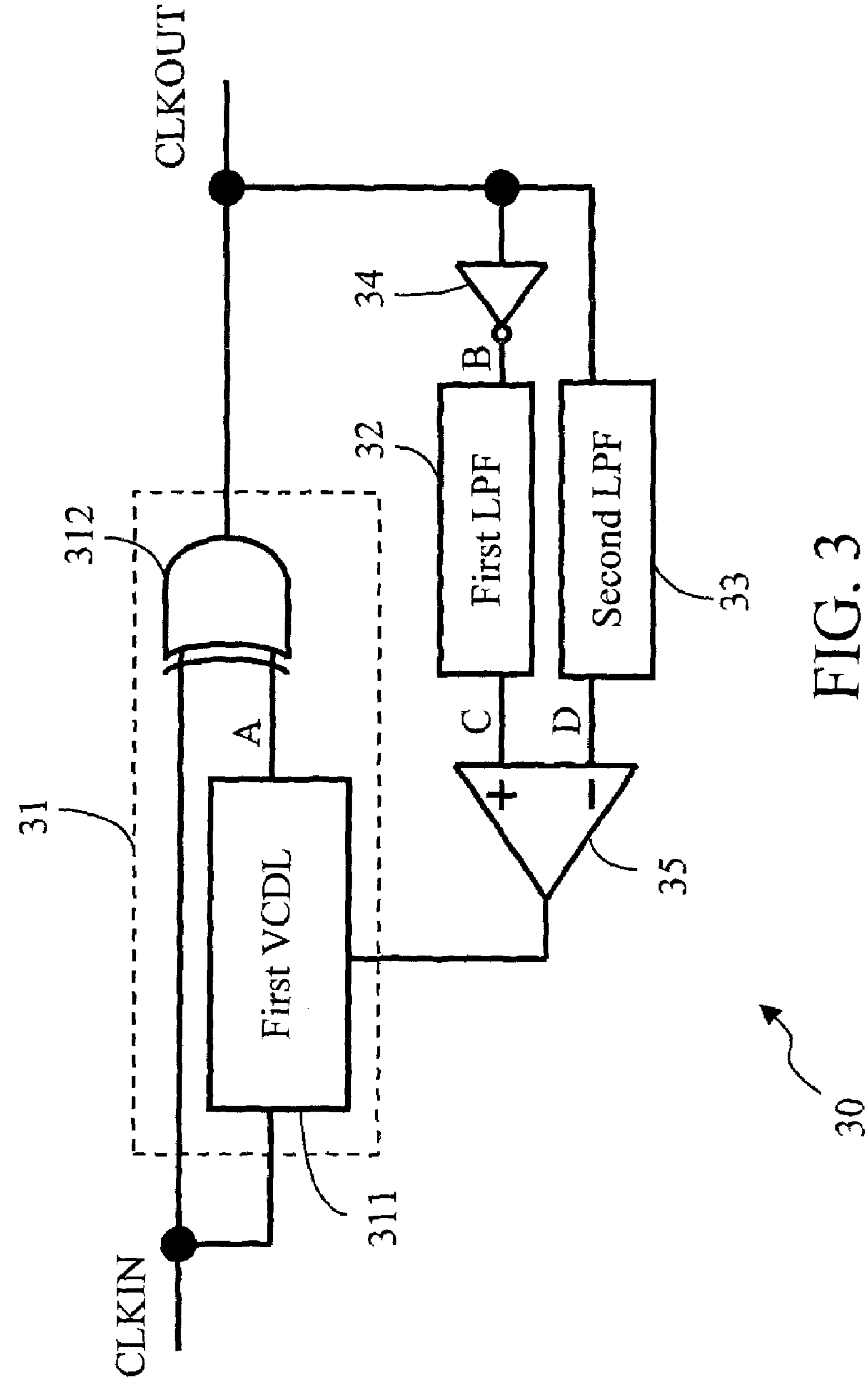
FIG. 3 illustrates a 2X clock multiplier of the first embodiment of the present invention.
Figure 4:
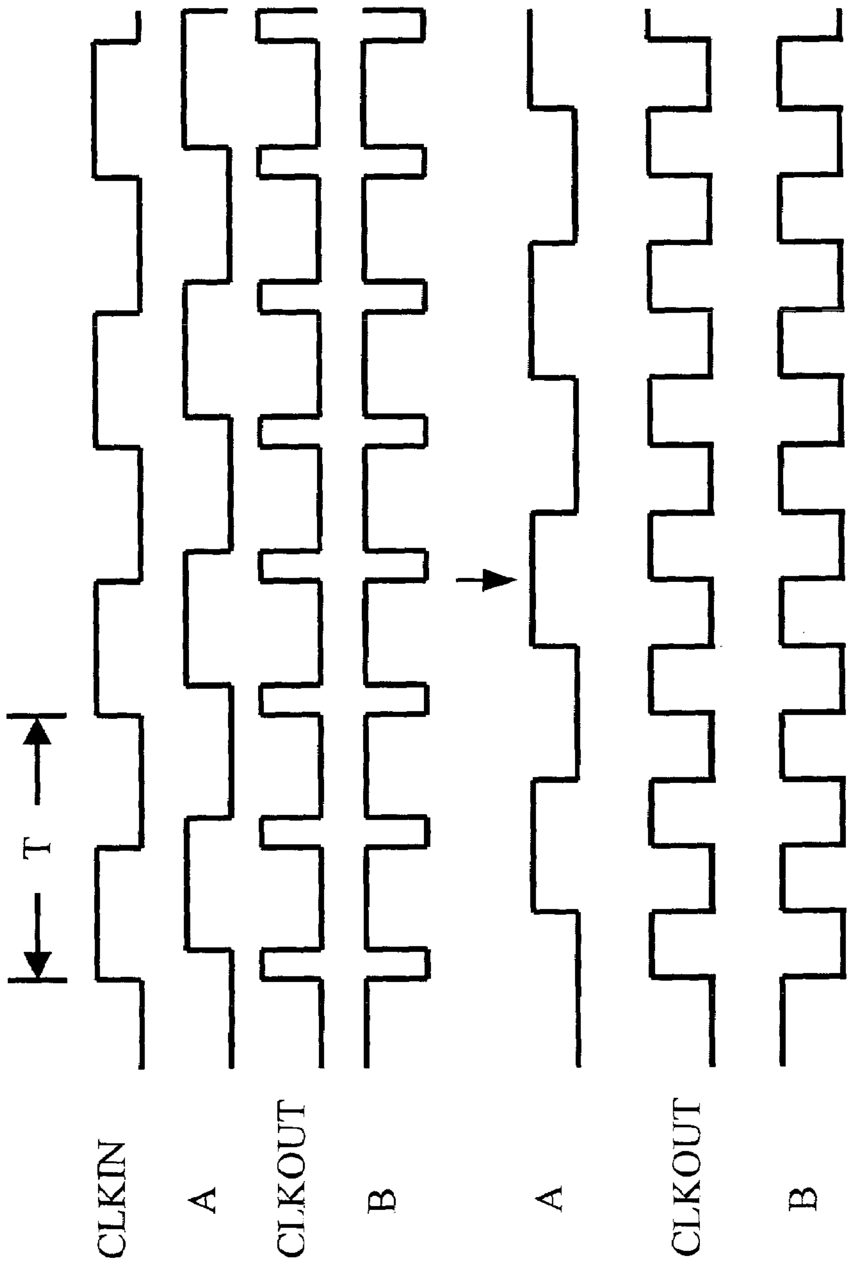
FIG. 4 is the timing diagram of the 2X clock multiplier shown in FIG. 3.

FIG. 3 illustrates the circuitry of a 2X clock multiplier 30 of the first embodiment of the present invention, and the corresponding timings of the points in FIG. 3 are shown in FIG. 4. The 2X clock multiplier 30 comprises a first clock multiplication circuit 31, an inverter 34, a first LPF 32, a second LPF 33 and an operational amplifier 35, the first clock multiplication circuit 31 receiving a CLKIN, and outputting a CLKOUT. The CLKOUT can be controlled by the feedback loop of the inverter 34, the first LPF 32, the second LPF 33 and the operational amplifier 35. The first clock multiplication circuit 31 consists of a first VCDL 311 and a first XOR gate 312. The CLKIN is as one input to the first OR gate 312, and a delayed T/4 clock generated from the first VCDL 311 is as the other one. Accordingly, the frequency of the CLKOUT outputted from the first XOR gate 312 doubles that of the CLKIN.

Theoretically, if the first VCDL 311 can exactly delay the CLKIN by T/4, the duty cycle of the CLKOUT will be 50%.

However, if the clock delay by the first VCDL 311 is less than T/4, the duty cycle of the CLKOUT will be uneven, i.e., the time of high level is much less than that of low level. Such phenomenon can be referred from FIG. 3 and FIG. 4, in which the location behind the first VCDL 311 is designated as "A" shown in FIG. 3, and the corresponding timing of clock "A" is shown in FIG. 4. The CLKOUT inverted by the inverter 34 will generate a clock "B," of which the time of high level is much greater than that of low level. Generally, LPF is constituted of RC components, in which the capacitor will be charged as the input clock is at high level, and be discharged as the input clock is at low level. Because of the uneven proportion of high and low levels, the charging time and discharging time of the first LPF 32 and the second LPF 33 will be different. With respect to the "C" point of FIG. 3, due to the short discharging time, the capacitor of the first LPF 32 will be recharged when the containing charges are not completely released yet, inducing that the voltage at "C" point ramps up. On the contrary, due to the short charging time, the capacitor of the second LPF 33 will again be discharged when the charges are not completely filled yet, inducing that the voltage at "D" point ramps down. The output voltage of the operational amplifier 35 is equivalent to the difference between the output voltages of the first LPF 32 and the second LPF 33 multiplied by a coefficient, so the output voltage of the operational amplifier 35 will increase. As a result, the first VCDL 311 gradually increases the delay time of the output clock ("A" point) to approach T/4, and thus duty cycles of the CLKOUT and the clock "B" will approach 50%. The first VCDL 311 will cease the clock delay modulation if the CLKOUT reaches equilibrium, i.e., the duty cycle is equal to 50%. The operational amplifier 35 is illustrative only, a comparator or an amplifier having transistors can be selected as an alternative also.

Figure 5:
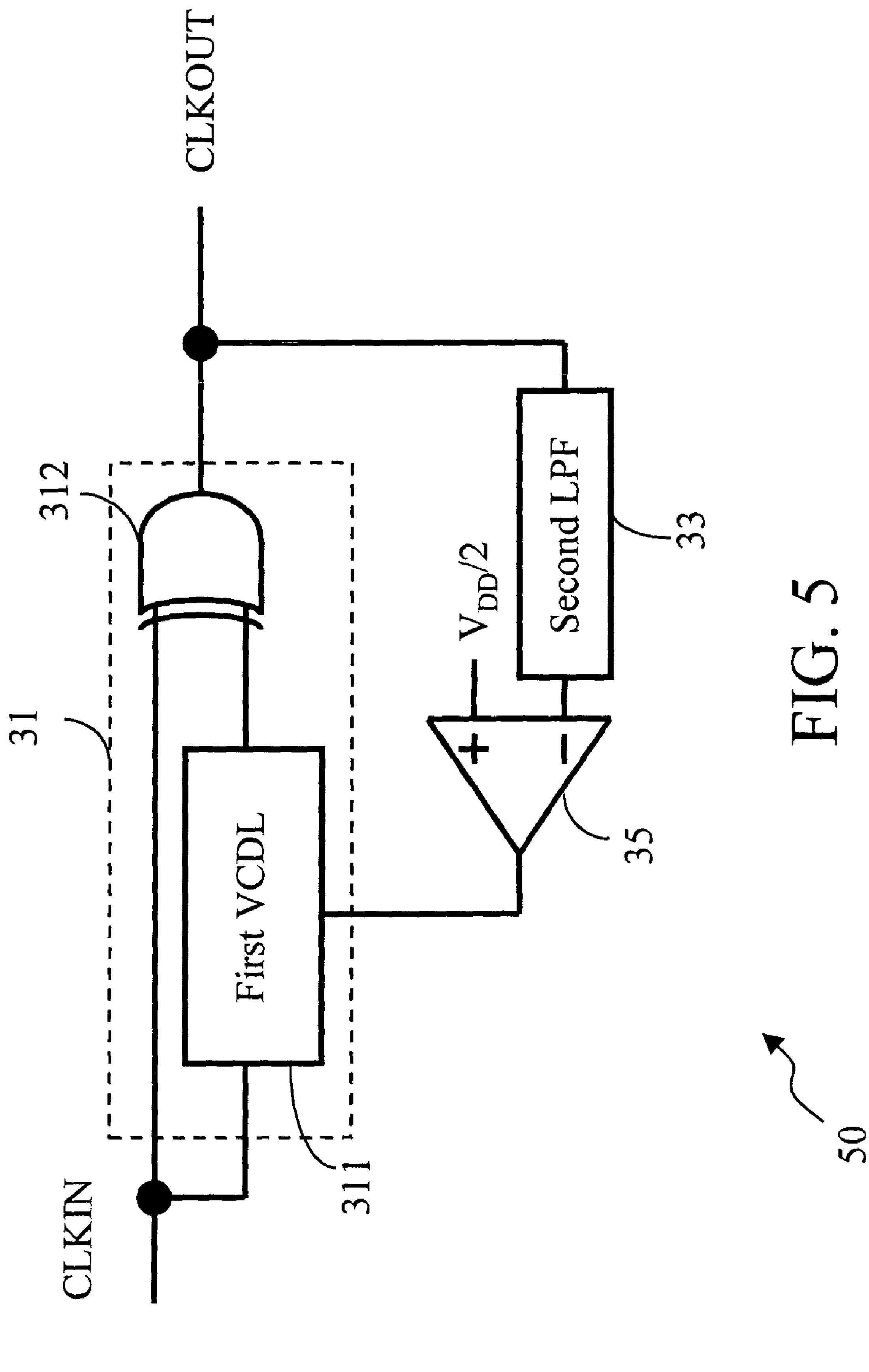
FIG. 5 illustrates a 2X clock multiplier of the second embodiment of the present invention.

If the CLKIN has a full voltage swing, the high voltage is equivalent to the supply voltage $V_{DD}$, and the low voltage is equivalent to ground. Therefore, a reference voltage $V_{DD}/2$ can be selected to substitute the inverter 34 and the first LPF 32 to form a 2X clock multiplier 50, the second embodiment of the present invention, shown as in FIG. 5. Likewise, such manner can also apply to the following embodiments as an alternative.

Figure 6:
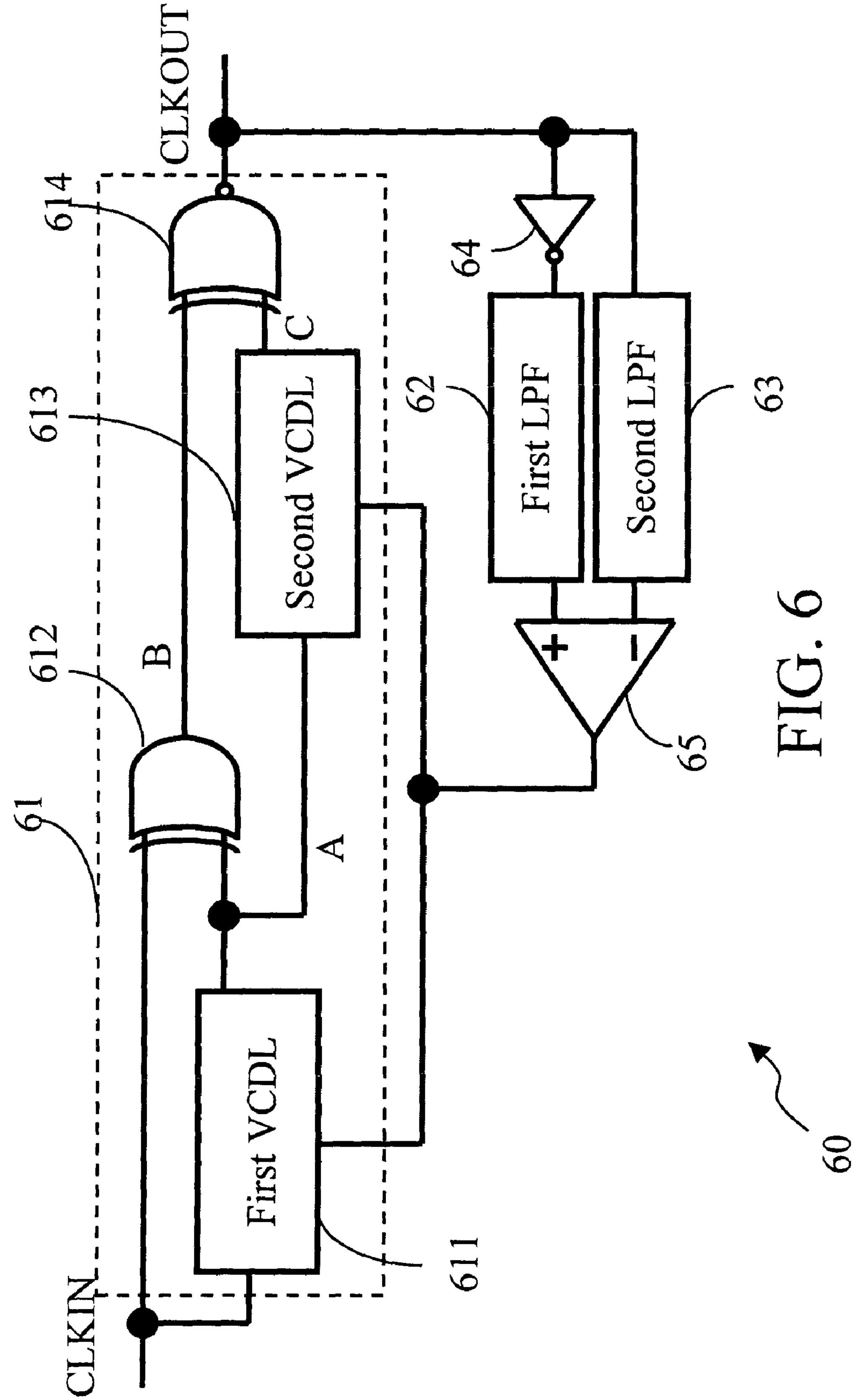
FIG. 6 illustrates a 3X clock multiplier of the third embodiment of the present invention.
Figure 7:
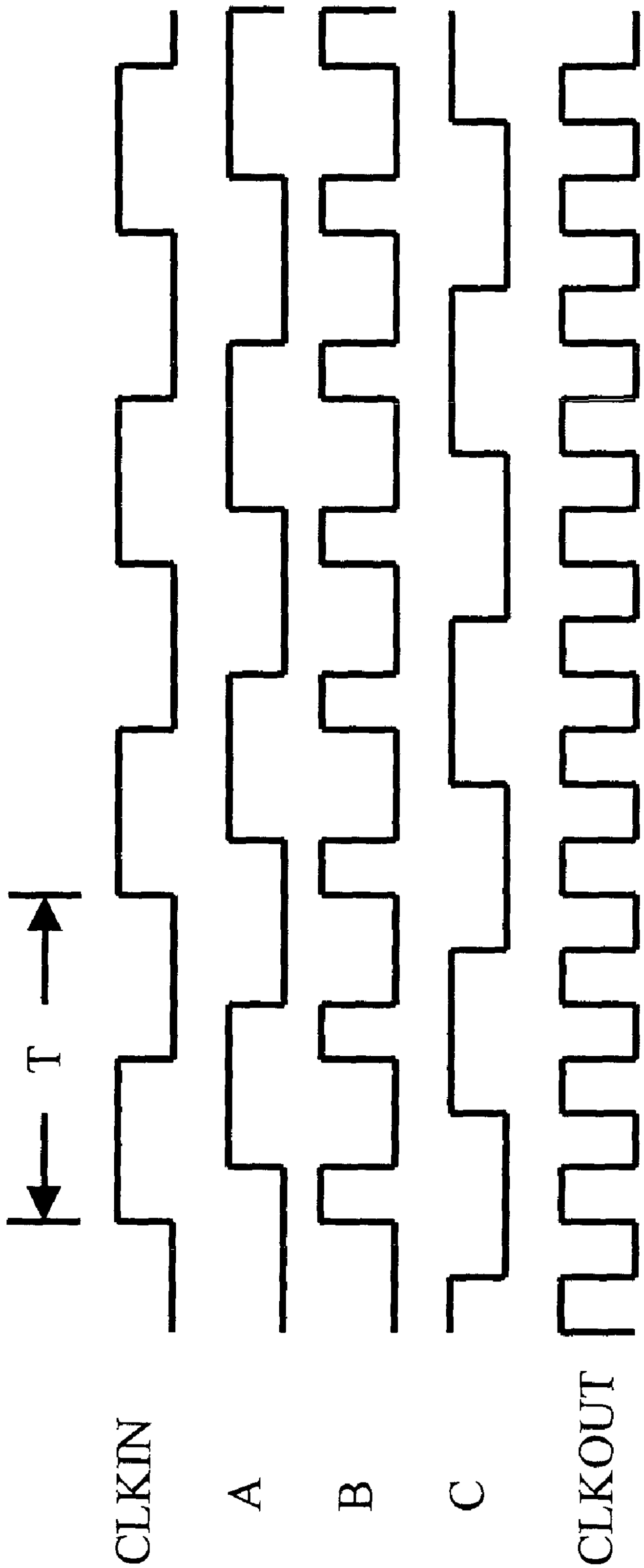
FIG. 7 is the timing diagram of the 3X clock multiplier shown in FIG. 6.

FIG. 6 illustrates the circuitry of a 3X clock multiplier 60 using the above-mentioned manner, and FIG. 7 shows the corresponding timings of the points shown in FIG. 6. The 3X clock multiplier 60 comprises a first clock multiplication circuit 61, an inverter 64, a first LPF 62, a second LPF 63 and an operational amplifier 65. The first clock multiplication circuit 61 receives a CLKIN and outputs a CLKOUT, which may be controlled by the feedback loop of the inverter 64, the first LPF 62, the second LPF 63 and the operational amplifier 65 so as to modulate the clock delay of first clock multiplication circuit 61. The first clock multiplication circuit 61 is constituted by a first VCDL 611 and an XOR gate 612, a second VCDL 613 and a XNOR (exclusive NOR) gate 614. Both the CLKIN and the clock modulated by the first VCDL 611 are as the inputs of the XOR gate 612, the first VDCL 611 delays the CLKIN by T/6 (referring to the clock "A"), so the frequency of the output clock of XOR gate 612 (referring to the clock "B") doubles that of the CLKIN, and its duty cycle is approximately equivalent to one-third. Likewise, the clock "A" is delayed T/6 by the second VCDL 613 (referring to the clock "C") to be an input of the XNOR gate 614, and the clock "B" is as the other input of that. Accordingly, the frequency of the CLKOUT triples that of the CLKIN. If the duty cycle of the CLKOUT is not 50%, the above-mentioned modulation manner can also be employed by the feedback loop of the first LPF 62, the second LPF 63, the inverter 64 and the operational amplifier 65, so as to modulate the duty cycle to approach 50%.

Figure 8:
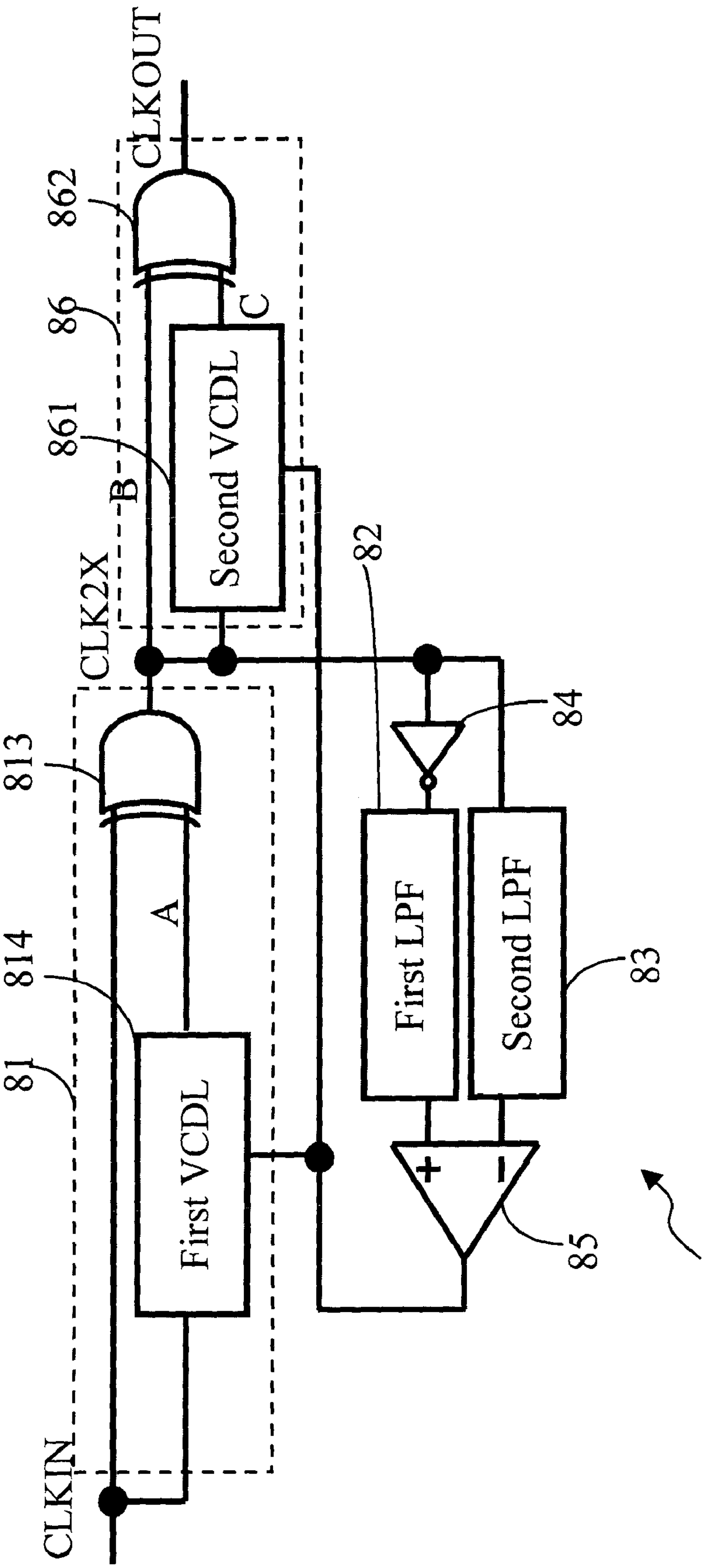
FIG. 8 illustrates a 4X clock multiplier of the fourth embodiment of the present invention.
Figure 9:
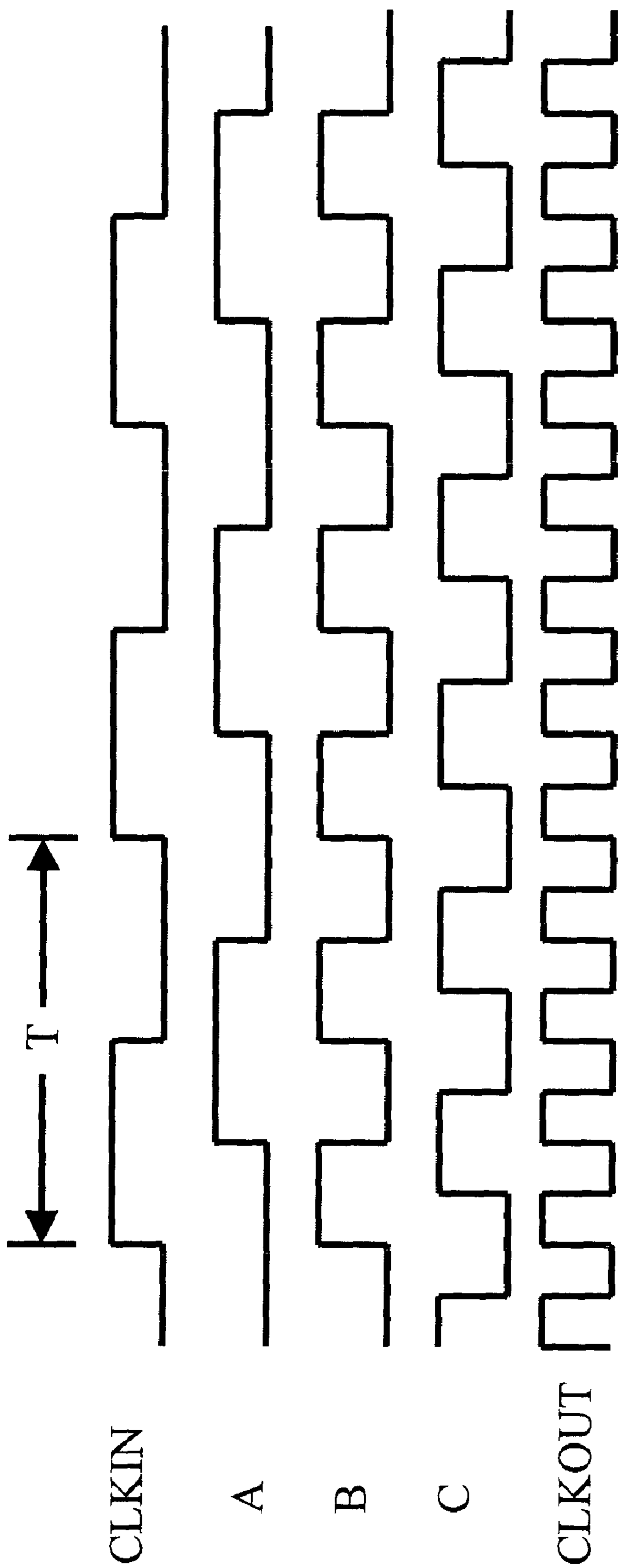
FIG. 9 is the timing diagram of the 4X clock multiplier shown in FIG. 8.

FIG. 8 illustrates the circuitry of a 4X clock multiplier 80 of the fourth embodiment of the present invention, and FIG. 9 shows the corresponding timings of the points shown in FIG. 8. The 4X clock multiplier 80 is associated with two 2X clock multipliers, iteratively doubling the frequency of a CLKIN from 2X to 4X. The 4X clock multiplier 80 comprises a first clock multiplication circuit 81, a second clock multiplication circuit 86, an inverter 84, a first LPF 82, a second LPF 83 and an operational amplifier 85, the first clock multiplication circuit 86 including a first VCDL 814 and a first XOR gate 813, functioning as the first VCDL 31 of the 2X clock multiplier 30 for doubling the frequency of the CLKIN, and the second clock multiplication circuit 86 including a second VCDL 861 and a second XOR gate 862. The CLKIN and the output of the first VCDL 814, i.e., the clock "A," are inputted to the first XOR gate 813, and the output clock of the first XOR gate 813, designated as CLK2X, has double the frequency to that of the CLKIN. The second XOR gate 862 receives the CLK2X and the output clock of the second VCDL 861 (clock "C"), and outputs a CLKOUT. Likewise, the CLK2X is controlled by a feedback loop of the inverter 84, the first LPF 82, the second LPF 83 and the operational amplifier 85. If the duty cycle of the CLKOUT is not equal to 50%, which can be corrected by modulating the delay times of the output clocks of the first VCDL 814 and the second VCDL 861. The first VCDL 814 and the second VCDL 861, under the same control voltage, respectively delay T/4 and T/8 of their input clocks to induce a 4X clock multiplication.

Figure 10:
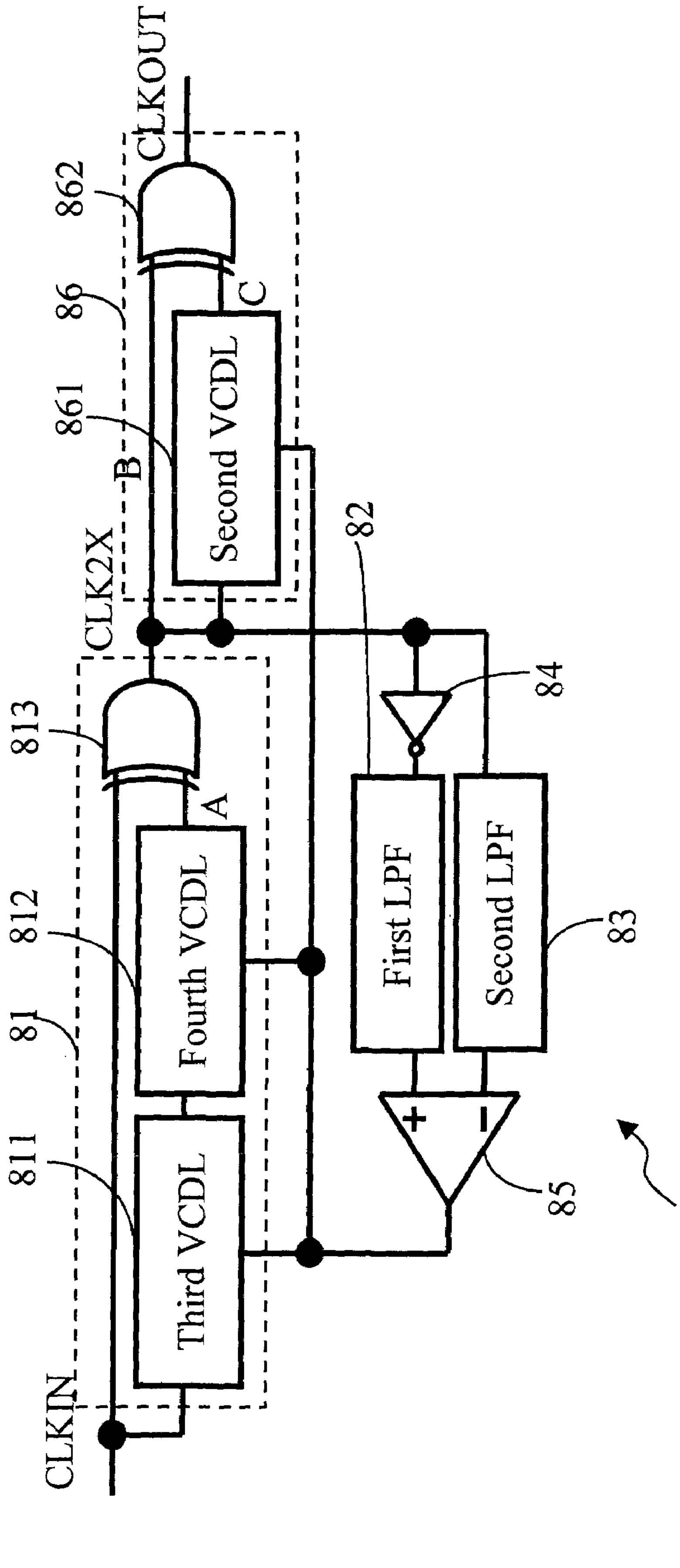
FIG. 10 illustrates a 4X clock multiplier of the fifth embodiment of the present invention.

FIG. 10 illustrates a 4X clock multiplier 100 of the fifth embodiment of present invention, which is based on the 4X clock multiplier 80 of the fourth embodiment except the first VCDL 814 is substituted by a third VCDL 811 and a fourth VCDL 812 connected in series, and both the third VCDL 811 and the fourth VCDL 812 are operative to delay T/8. Likewise, the third VCDL 811 and the fourth VCDL 812 is controlled by the feedback loop of the inverter 84, the first LPF 82, the second LPF 83 and the operational amplifier 85 to modulate the duty cycle of the CLKOUT. As a result, all the second VCDL 861, the third VCDL 811 and the fourth VCDL 812 are operative to delay T/8, so the clock "A" delayed by T/4 to CLKIN, and the clock "C" delayed by T/8 to CLK2X can be accomplished by a single control voltage.

The above-described embodiments of the present invention are intended to be illustrative only. Numerous alternative embodiments may be devised by those skilled in the art without departing from the scope of the following claims.

What is claimed is:

1. A clock multiplier, comprising:
- a first clock multiplication circuit for multiplying the frequency of an input clock based on a delay time;
- an inverter for inverting the output clock of the first clock multiplication circuit;
- a first low pass filter connected to the output of the inverter;
- a second low pass filter connected to the output of the first clock multiplication circuit; and
- an amplifier for comparing the output voltages of the first low pass filter and the second low pass filter so as to feedback-control the delay time of the first clock multiplication circuit.

2. The clock multiplier in accordance with claim 1, wherein the first clock multiplication circuit comprises:

a first voltage-controlled delay line for delaying the input clock by the delay time; and a first exclusive OR (XOR) gate connected to the input clock and the output of the first voltage-controlled delay line.

3. The clock multiplier in accordance with claim 2, wherein the first voltage-controlled delay line is operative to delay the input clock by one-fourth period of the input clock.

4. The clock multiplier in accordance with claim 2, which is a clock doubler.

5. The clock multiplier in accordance with claim 1, wherein the duty cycle of the output clock of the first clock multiplication circuit is approximately 50%.

6. The clock multiplier in accordance with claim 1, wherein the first clock multiplication circuit comprises:

a first voltage-controlled delay line for delaying the input clock by the delay time;

an XOR gate connected to the input clock and the output of the first voltage-controlled delay line;

a second voltage-controlled delay line for delaying the output clock of the first voltage-controlled delay line by the delay time; and an exclusive NOR (XNOR) gate connected to the outputs of the XOR gate and the second voltage-controlled delay line.

7. The clock multiplier in accordance with claim 6, wherein the first voltage-controlled delay line and the second voltage-controlled delay line respectively delay the input clock and the output clock of the first voltage-controlled delay line by one-sixth period of the input clock.

8. The clock multiplier in accordance with claim 6, which is a 3X clock multiplier.

9. The clock multiplier in accordance with claim 2, further comprising a second clock multiplication circuit, which comprises:

a second voltage-controlled delay line for delaying the output of the first XOR gate by the delay time; and a second XOR gate connected to the outputs of the first XOR gate and the second voltage-controlled delay line.

10. The clock multiplier in accordance with claim 9, wherein the first voltage-controlled delay line and the second voltage-controlled delay line respectively delay the input clock and the output clock of the first XOR gate by one-fourth period and one-eighth period of the input clock.

11. The clock multiplier in accordance with claim 9, which is a 4X clock multiplier.

12. The clock multiplier in accordance with claim 10, wherein the first voltage-controlled delay line is constituted by a third voltage-controlled delay line and a fourth voltage-controlled delay line connected in series, and the third voltage-controlled delay line and the fourth voltage-controlled delay line individually delay the input clock by one-eighth period of the input clock.

13. A clock multiplier, comprising:

a first clock multiplication circuit for multiplying the frequency of an input clock based on a delay time;

a second low pass filter connected to the output of the first clock multiplication circuit;

an amplifier for comparing a one-half supply voltage and the output voltage of the second low pass filter so as to feedback-control the delay time of the first clock multiplication circuit; and a second clack multiplication circuit, which comprises:

a second voltage-controlled delay line for delaying the output of a first XOR gate by the delay time; and a second XOR gate connected to the outputs of the first XOR gate and the second voltage-controlled delay line.

14. The clock multiplier in accordance with claim 13, wherein the first clock multiplication circuit comprises:

a first voltage-controlled delay line for delaying the input clock by the delay time, wherein the first XOR gate is connected to the input clock and the output of the first voltage-controlled delay line.

15. The clock multiplier in accordance with claim 13, wherein the duty cycle of the output clock of the first clock multiplication circuit is approximately 50%.

16. A clock multiplier, comprising:

a first clock multiplication circuit for multiplying the frequency of an input clock based on a delay time;

a second low pass filter connected to the output of the first clock multiplication circuit; and an amplifier for comparing a one-half supply voltage and the output voltage of the second low pass filter so as to feedback-control the delay time of the first clock multiplication circuit, wherein the first clock multiplication circuit comprises:

a first voltage-controlled delay line for delaying the input clock by the delay time;

an XOR gate connected to the input clock and the output of the first voltage-controlled delay line;

a second voltage-controlled delay line for delaying the output of the first voltage-controlled delay line by the delay time; and an XNOR gate connected to the outputs of the XOR gate and the second voltage-controlled delay line.

17. The clock multiplier in accordance with claim 16, wherein the duty cycle of the output clock of the first clock multiplication circuit is approximately 50%.

* * * * *